US009949413B2

(12) United States Patent
Wang et al.

(10) Patent No.: US 9,949,413 B2
(45) Date of Patent: Apr. 17, 2018

(54) HEAT-DISSIPATING STRUCTURE FOR VSD, AND CONTROL METHOD AND DEVICE

(71) Applicants: Yingqiang Wang, Shanghai (CN); Haiyuan Yu, Shanghai (CN)

(72) Inventors: Yingqiang Wang, Shanghai (CN); Haiyuan Yu, Shanghai (CN)

(73) Assignee: SCHNEIDER TOSHIBA INVERTER EUROPE SAS, Pacy-sur-Eure (FR)

( * ) Notice: Subject to any disclaimer, the term of this patent is extended or adjusted under 35 U.S.C. 154(b) by 28 days.

(21) Appl. No.: 15/025,778

(22) PCT Filed: Sep. 29, 2014

(86) PCT No.: PCT/CN2014/087759
§ 371 (c)(1),
(2) Date: Mar. 29, 2016

(87) PCT Pub. No.: WO2015/043535
PCT Pub. Date: Apr. 2, 2015

(65) Prior Publication Data
US 2016/0249491 A1    Aug. 25, 2016

(30) Foreign Application Priority Data

Sep. 30, 2013   (CN) .......................... 2013 1 0460252

(51) Int. Cl.
*H05K 7/20*           (2006.01)
(52) U.S. Cl.
CPC ..... *H05K 7/20909* (2013.01); *H05K 7/20209* (2013.01); *H05K 7/20918* (2013.01); *H05K 7/20945* (2013.01)
(58) Field of Classification Search
CPC .......... H05K 7/20945; H05K 7/20909; H02M 7/003; F04D 19/005

(Continued)

(56) References Cited

U.S. PATENT DOCUMENTS 6,152,699 A * 11/2000 Shikata ................. F04D 19/005
                                                              417/12
7,023,712 B2 * 4/2006 Miettinen ............... H02M 5/16
                                                              361/678

(Continued)

FOREIGN PATENT DOCUMENTS

CN          202121488 U      1/2012
CN          102595851 A      7/2012

(Continued)

OTHER PUBLICATIONS

Chinese Office Action issued by the Chinese Patent Office from corresponding Chinese Application No. 201310460252.8 dated Aug. 3, 2016 [Full English Translation attached].

(Continued)

*Primary Examiner* — Mukund G Patel
(74) *Attorney, Agent, or Firm* — Lando & Anastasi, LLP

(57) ABSTRACT

A heat-dissipating structure for a variable speed drive (VSD), a VSD device having the heat-dissipating structure, and a method for controlling the heat-dissipating structure. The heat-dissipating structure comprises: an electronic element array, having a first end and an opposite second end, electronic elements in the array producing heat during operation; a heat-dissipating fan, disposed at the first end of the array and used to conduct cooling air to flow between the first end and the second end to cool the electronic elements in the array; and a control apparatus, for controlling operation of the fan, the control apparatus controlling the fan so that the fan rotates at a first rotation direction within a first time period to conduct the cooling air to flow from the second end to the first end, and rotates at a second rotation direction contrary to the first rotation direction within a second time period to conduct the cooling air to flow from the first end to the second end.

9 Claims, 3 Drawing Sheets

(58) Field of Classification Search
USPC .......................................... 361/678, 690–700
See application file for complete search history.

(56) References Cited

U.S. PATENT DOCUMENTS

| | | |
|---|---|---|
| 2006/0087812 A1 | 4/2006 | Meyer |
| 2009/0190625 A1 | 7/2009 | Chung et al. |
| 2012/0219399 A1* | 8/2012 | Suzuki .................... G06F 1/206 |
| | | 415/1 |
| 2012/0275115 A1 | 11/2012 | Chen |

FOREIGN PATENT DOCUMENTS

| | | |
|---|---|---|
| CN | 102762080 A | 10/2012 |
| CN | 103019195 A | 4/2013 |
| EP | 2296453 A2 | 3/2011 |

OTHER PUBLICATIONS

International Preliminary Report on Patentability from corresponding PCT/CN2014/087759 dated Apr. 5, 2016.
International Search Report and Written Opinion from corresponding PCT/CN2014/087759 dated Dec. 29, 2014.
Extended European Search Report from corresponding European Application No. 14849915.5 dated Mar. 8, 2017.
Second Chinese Office Action issued by the Chinese Patent Office from corresponding Chinese Application No. 201310460252.8 dated Mar. 23, 2017 [Full English Translation attached].

* cited by examiner

US 9,949,413 B2

HEAT-DISSIPATING STRUCTURE FOR VSD, AND CONTROL METHOD AND DEVICE

CROSS-REFERENCE TO RELATED APPLICATIONS

This application is the U.S. National Phase Application under 35 U.S.C. § 371 of International Application No. PCT/CN2014/087759, filed Sep. 29, 2014, which claims priority to Chinese Patent Application No. CN201310460252.8, filed Sep. 30, 2013. These prior applications are incorporated by reference herein in their entirety.

TECHNICAL FIELD

The present invention relates to a cooling structure of variable speed drive apparatus, particularly to a cooling structure with a fan that rotates in two directions and a method to control the cooling structure. It also relates to VSD apparatus that includes said cooling structure.

BACKGROUND

Capacitors and other electronic elements within the VSD (Variable Speed Drive) apparatus generate heat. If the heat cannot be emitted effectively, it will result in a rise in the temperature of the capacitors and other electronic elements, even failure of the apparatus. For this reason, there is a need for a cooling structure to direct cool air going through the heated elements, emitting the heat out of the apparatus. Generally, the cooling fan provided in a conventional VSD apparatus is provided at a first end, can rotate in only one direction, and direct cool air flow from a second end that is opposite to the first end to the first end. Since the temperature of the cool air starts to rise at the second end, cooling effect on the capacitors at the first end is reduced when the cool air reaches the first end. As a result, in terms of the whole array of capacitors, as the capacitors continue to operate, the capacitor at the first end gets increasing warmer compared to the capacitor at the second end. Due to inadequate cooling for the capacitor at the first end, the life span decreases, even to the extent that the apparatus fails. Therefore, there is a need for a cooling structure that is capable to adequately cool down the capacitors at both ends of the array of capacitors.

SUMMARY

The objective of the present invention is to eliminate the drawback of uneven cooling effect on the electronic elements within the VSD apparatus.

The present invention provides a cooling structure of the VSD apparatus, the cooling structure comprising:
  an array of electronic elements having a first end and a second end, the electronic elements of the array of electronic elements generating heat when they are in operation;
  a cooling fan that is provided at the first end of the array and is used to direct air stream flow between the first end and the second end in order to cool down the electronic elements of the array;
  a control device to control the operation of the fan;
  wherein the control device controls said fan in order to make the fan rotate in a first rotating direction for a first period of time, direct cooling air stream flow from the second end to the first end, and then rotate in a second rotating direction that is the reverse of the first rotating direction for a second period of time and direct the cooling air stream flow from the first end to the second end.

In accordance with an aspect of the invention, the electronic elements include capacitors.

In accordance with an aspect of the invention, the control device controls said fan in order to make the fan operate for the first period of time and the second period of time alternatively.

In accordance with an aspect of the invention, the cooling structure further comprises temperature sensors for detecting the temperatures of the electronic elements at the first and second ends.

In accordance with an aspect of the invention, the control device controls the lengths of the first and second periods of time based on the detected temperatures by the sensors at the first and second ends.

In accordance with another aspect of the invention, the fan is a two-direction axial flow cooling fan.

In accordance with another aspect of the invention, the fan is an AC motor fan.

In accordance with another aspect of the invention, the control device alternates the direction of the current supplied to the fan based on the pulse signals sent from a CPU.

The invention further provides VSD apparatus that comprises the aforementioned cooling structure.

The invention further provides a method for controlling the cooling structure of the VSD apparatus, the cooling apparatus comprising:
  an array of electronic elements having a first end and a second end, the electronic elements of the array of electronic elements generating heat when they are in operation;
  a cooling fan that is provided at the first end of the array and is used to direct air stream flow between the first end and the second end in order to cool down the electronic elements of the array;
  a control device to control the operation of the fan;
  said method comprises following steps:
  a) controlling the fan by the control device in order to make the fan rotate in a first direction for a first period of time and direct cooling air stream flow from the second end to the first end, and
  b) controlling the fan by the control device in order to make the fan rotate in a second direction that is the reverse of the first direction for a second period of time and direct the cooling air stream flow from the first end to the second end.

In accordance to an aspect of the invention, the method further includes: repeat steps a) and b).

The cooling effect on the VSD apparatus can be improved by the invention.

DESCRIPTION OF THE PREFERRED EMBODIMENTS

Figure 1:
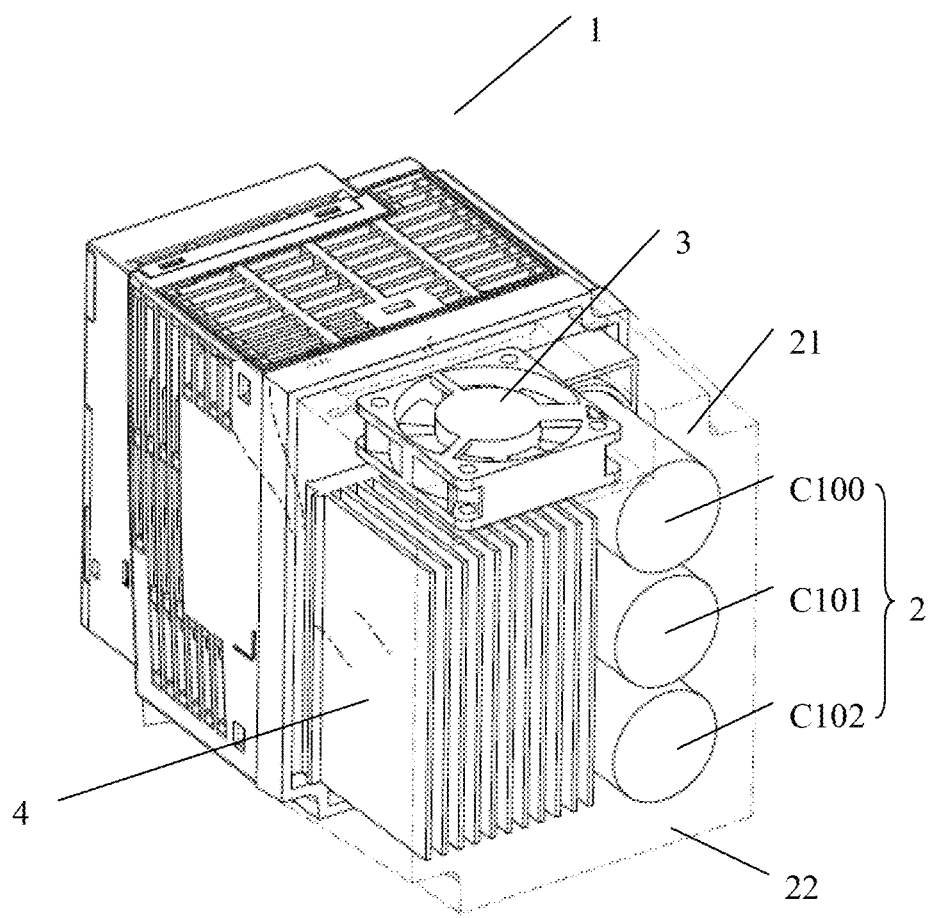
FIG. 1 is a perspective view of the cooling structure of the VSD apparatus according to the invention.

VSD apparatus 1 may comprise an array of electronic elements (e.g. an array 2 of capacitors), a cooling fan 3, cooling fins 4, and other electronic elements (not shown). The array 2 of capacitors, the cooling fan 3, the cooling fins 4, and other electronic elements can be located within the case body (not shown) of the VSD apparatus 1.

When the VSD apparatus 1 is in operation, the array 2 of capacitors and other electronic elements may generate heat, resulting in a rise in the temperatures within the case body and of the electronic elements themselves. For this reason, the cooling fan 3 provided in the VSD apparatus 1 rotates to direct air stream going through and cool down the array 2 of capacitors and other electronic elements and emit the air stream out of the case body of the VSD apparatus 1 through air vents (not shown).

The array 2 of capacitors may comprise a plurality of capacitors, for example, three capacitors C100-C102. The array of capacitors is not limited to consisting of the three capacitors C100-C102, but could comprise any number of capacitors.

It should be appreciated that although the electronic elements within the VSD apparatus of the present invention are described with regard to the array 2 of capacitors, it is not used to limit the array of capacitors of the present invention. Any other array of electronic elements is also applicable to the present invention.

The cooling fan 3 is provided near the array 2 of capacitors and is used to dissipate heat generated by the plurality of capacitors of the array. Generally, the array 2 of capacitors comprises a first end 21 and a second end 22 that is opposite to the first end 21. The cooling fan 3 may be provided at the first end 21 or the second end 22. The cooling fan 3 may comprise one or more fans, for example, one, two, three, or four fans, etc.

Figure 2:
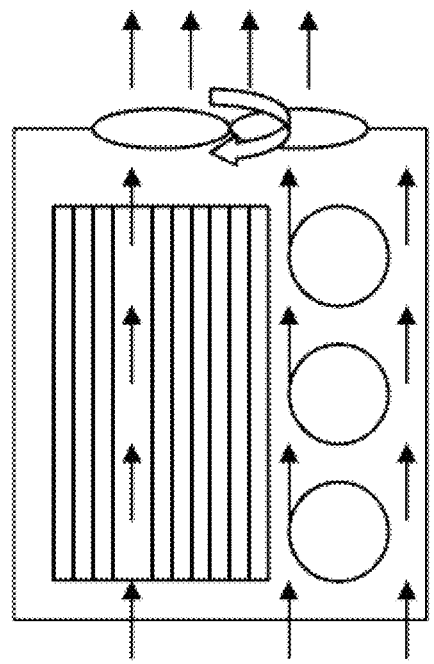
FIG. 2 shows the direction of the cooling air stream within the VSD apparatus when the fan rotates in the first rotating direction.
Figure 3:
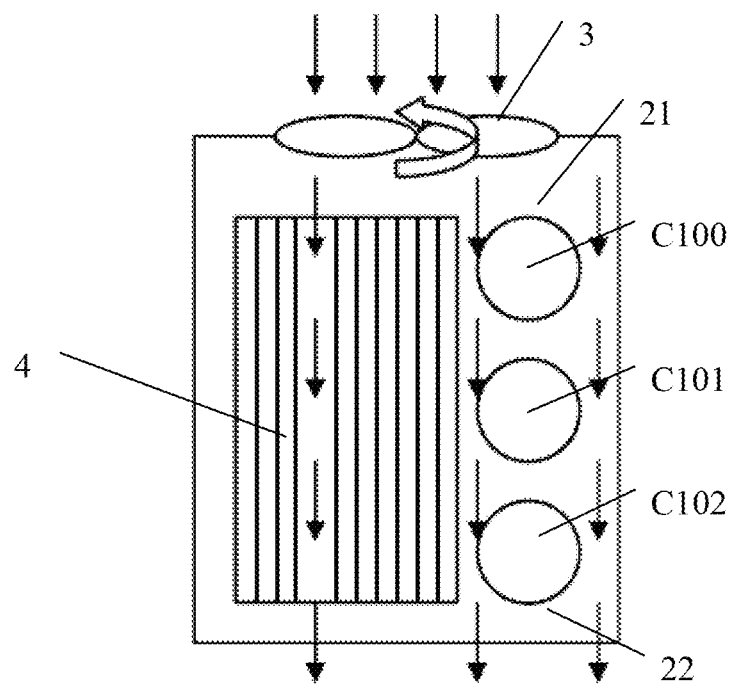
FIG. 3 shows the direction of the cooling air stream within the VSD apparatus when the fan rotates in the second rotating direction.

The cooling fan 3 may be an axial flow fan. In one example, the cooling fan 3 is an AC fan, with a rated voltage of 230 Vac, for example. The cooling fan 3 can rotate in both clockwise and counterclockwise directions. As shown in FIG. 2, when the cooling fan 3 rotates in the clockwise direction, it directs the air stream flow from the second end 22 to the first end 21 of the array 2 of capacitors, and the air stream cools down the capacitors C102, C101, and C100 in sequence. As shown in FIG. 3, when the fan 3 rotates in the counterclockwise direction, it directs the air stream flow from the first end 21 to the second end 22 of the array 2 of capacitors, and the air stream cools down the capacitors C100, C101, and C102 in sequence.

It is possible to provide a control device to control the rotating direction of the cooling fan 3 and the length of time the fan continues to rotate. The control device may be in the form of a control relay 5. It should be appreciated that the control device is not limited to the control relay, but could be any device that is able to control the rotating direction of the fan and the length of time the fan continues to rotate, including but not limited to a time relay, a logical circuit, or a programmable controller, for example.

Figure 4:
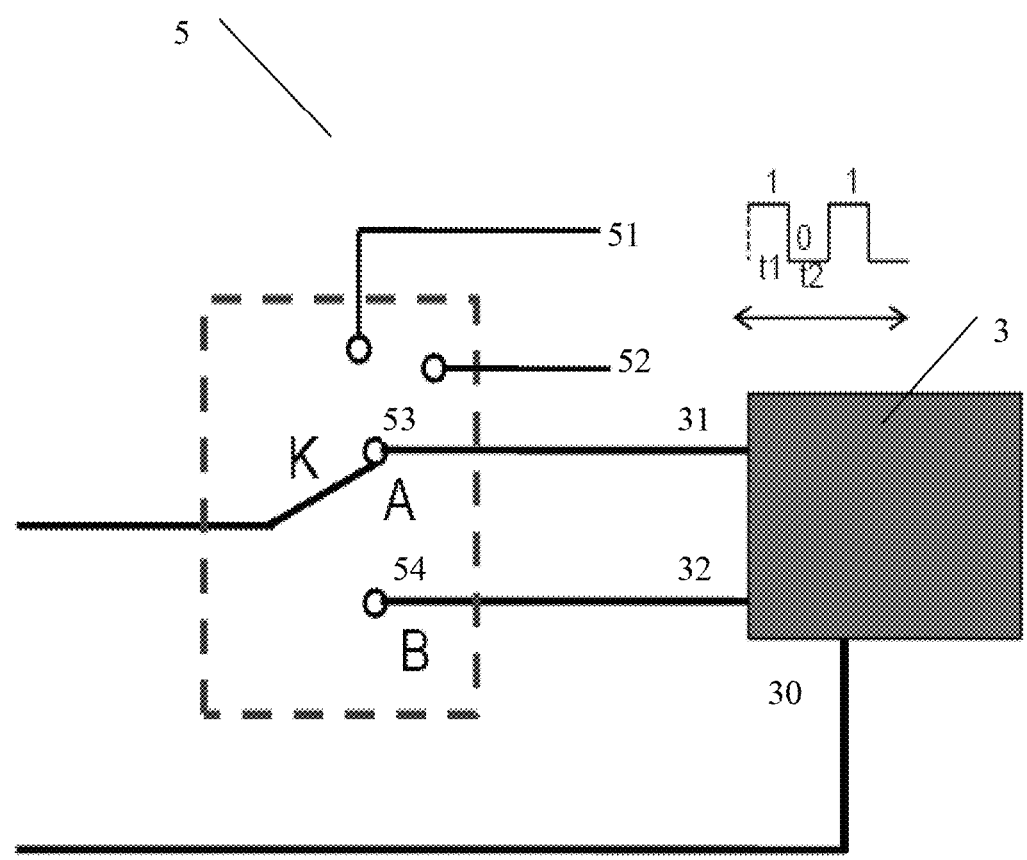
FIG. 4 is an illustration of a control circuit.

As shown in FIG. 4, the control relay 5 is used to control the rotation of the fan 3 and comprises control signal inputs 51, 52 and control signal outputs 53, 54. The control relay 5 receives control signal from CPU (not shown) and switches a contact K between contacts A and B. When the contact K comes into contact with the contact A, fan power lines 30 and 31 supply power to the fan 3, and the fan 3 rotates in the clockwise direction. When the contact K comes into contact with the contact B, fan power lines 30 and 32 supply power to the fan 3, and the fan 3 rotates in the counterclockwise direction. The power line 30 is a common line, and the power lines 31 and 32 are used to control the rotating direction of the fan 3.

Control signals can be pulse signals from the CPU, for example. When the inputs 51 and 52 receive a high level signal (1) with pulse width t1, the relay 5 will put the contact K into contact with the contact A, and the fan 3 will rotate in the clockwise direction for a period of time t1. On the contrary, when the inputs 51 and 52 receive low level signal (0) with pulse width t2, the relay 5 will put the contact K into contact with the contact B, and the fan 3 will rotate in the counterclockwise direction for a period of time t2. In other words, the cooling fan 3 is controlled to rotate in the clockwise direction for a period of time t1 and then to rotate in the counterclockwise direction for a period of time t2. The periods of time t1 and t2 can alternate with each other. Namely, the cooling fan 3 can rotate for a period of time t1 (in the clockwise direction), and then for a period of time t2 (in the counterclockwise direction), and then for a period of time t1 (in the clockwise direction), and then for a period of time t2 (in the counterclockwise direction), and so on.

In accordance with a preferred embodiment, it is possible to provide temperature sensors (not shown) at the capacitors at the first end 21 and the second end 22 of the array 2 of capacitors. The CPU receives signals that represent temperatures of the capacitors from the temperature sensors, and then outputs pulse signals with corresponding time lengths t1 and t2 to the control relay 5. In other words, the cooling fan rotates for a period of time t11 (in the clockwise direction), and then for a period of time t21 (in the counterclockwise direction), and then for a period of time t12 (in the clockwise direction), and then for a period of time t22 (in the counterclockwise direction), and so on, wherein the periods of time t11, t12, and so on can be different from each other. Precise feedback control to the rotation of the cooling fan 3 in the clockwise and counterclockwise directions can eliminate a time lag between the time when the cooling fan 3 operates and the time when the temperatures of the capacitors change, avoid overheat of the capacitors, and keep the temperatures stable.

In an example, the control to the cooling fan 3 can be PID (Proportion Integration Differentiation) control, and the cooling fan 3 can be a speed adjustable fan.

The present invention has been described above with reference to the accompanying drawings. However, the description is intended to provide examples of relevant features and ideas to the invention, but not to limit the scope of the invention. Those skilled in the art will recognize various alternations and modifications without departing from the scope of the appended claims.

The invention claimed is:

1. A cooling structure for VSD apparatus comprises:
    an array of electronic elements having a first end and a second end that is opposite to the first end, the electronic elements of the array generating heat when they are in operation;
    a cooling fan that is provided at the first end of the array and is used to direct cooling air stream flow between the first and second ends in order to cool down the electronic elements of the array;
    a control device controlling the operation of the fan;
    wherein the control device controls said fan in order to make the fan rotate in a first rotating direction for a first period of time so as to direct cooling air stream flow from the second end to the first end, and then rotate in a second rotating direction that is the reverse of the first rotating direction for a second period of time so as to direct the cooling air stream flow from the first end to the second end, wherein the cooling structure further comprises temperature sensors for detecting the temperatures of the electronic elements at the first and second ends, and wherein the control device controls the lengths of the first and second periods of time based on the detected temperatures by sensors at the first and second ends.

2. The cooling structure of the invention according to claim 1, wherein the electronic elements comprise a capacitor.

3. The cooling structure of the invention according to claim 1, wherein the control device controls the fan such that the fan operates in a manner that the first period of time and the second period of time are alternated.

4. The cooling structure of the invention according to claim 1, wherein the fan is a two-direction axial flow cooling fan.

5. The cooling structure of the invention according to claim 1, wherein the fan is an AC motor fan.

6. The cooling structure of the invention according to claim 1, wherein the control device alternates the direction of the current supplied to the fan based on the pulse signals sent from a CPU.

7. VSD apparatus that includes the cooling structure in accordance with claim 1.

8. A method for controlling a cooling structure of the VSD apparatus, the cooling apparatus comprising:

an array of electronic elements having a first end and a second end that is opposite to the first end, the electronic elements of the array of electronic elements generating heat when they are in operation;

a cooling fan that is provided at the first end of the array and is used to direct air stream flow between the first end and the second end in order to cool down the electronic elements of the array;

a control device controlling the operation of the fan;

said method comprises following steps:

a) controlling the fan by the control device such that the fan rotates in a first direction for a first period of time so as to direct cooling air stream flow from the second end to the first end, and b) controlling the fan by the control device such that the fan rotates in a second direction that is the reverse of the first direction for a second period of time so as to direct the cooling air stream flow from the first end to the second end, wherein the control device controls the lengths of the first and second periods of time based on the detected temperatures by sensors at the first and second ends.

9. The method of the invention according to claim 8, the method further includes: repeat steps a) and b).

* * * * *